US010465281B2

(12) United States Patent
Bly

(10) Patent No.: US 10,465,281 B2
(45) Date of Patent: Nov. 5, 2019

(54) HIGH RESOLUTION ADDITIVE MANUFACTURING METHOD WITH REAL MATERIALS

(71) Applicant: U.S.A. as represented by the Administrator of the National Aeronautics and Space Administration, Washington, DC (US)

(72) Inventor: Vincent T. Bly, Springfield, VA (US)

(73) Assignee: U.S.A. as represented by the Administrator of the National Aeronautics and Space Administration, Washington, DC (US)

(*) Notice: Subject to any disclaimer, the term of this patent is extended or adjusted under 35 U.S.C. 154(b) by 330 days.

(21) Appl. No.: 15/236,551

(22) Filed: Aug. 15, 2016

(65) Prior Publication Data

US 2018/0044786 A1 Feb. 15, 2018

(51) Int. Cl.
| | | |
|---|---|---|
| *C23C 16/01* | (2006.01) | |
| *B33Y 10/00* | (2015.01) | |
| *C23C 16/16* | (2006.01) | |
| *C23C 16/44* | (2006.01) | |
| *C23C 16/452* | (2006.01) | |
| *B33Y 80/00* | (2015.01) | |
| *B29C 64/135* | (2017.01) | |

(52) U.S. Cl.
CPC .............. *C23C 16/01* (2013.01); *B33Y 10/00* (2014.12); *B33Y 80/00* (2014.12); *C23C 16/16* (2013.01); *C23C 16/4412* (2013.01); *C23C 16/452* (2013.01); *B29C 64/135* (2017.08)

(58) Field of Classification Search
None
See application file for complete search history.

(56) References Cited

U.S. PATENT DOCUMENTS

2016/0052108 A1* 2/2016 Miess ................ B24D 18/0009
51/309

* cited by examiner

*Primary Examiner* — Mandy C Louie
(74) *Attorney, Agent, or Firm* — Christopher O. Edwards; Bryan A. Geurts

(57) ABSTRACT

The present invention relates to a high resolution additive manufacturing method, including: creating a rigid shell of a stable material on all surfaces except for a sprue of a three dimensional (3D) polymer part using a chemical vapor deposition (CVD) process which includes: depositing the stable material at a process temperature of 100° C. or less, and operating at, or near, atmospheric pressure; and removing the 3D polymer part by accessing the inside of the rigid shell through the sprue to allow dissolution of the 3D polymer part, thereby leaving a replicated rigid shell of the stable material.

7 Claims, 5 Drawing Sheets

HIGH RESOLUTION ADDITIVE MANUFACTURING METHOD WITH REAL MATERIALS

BACKGROUND OF THE INVENTION

1. Field of the Invention

The present invention relates in general to a process of fabricating high resolution, complex parts and, more particularly, to a process of fabricating high resolution, complex parts in metals and other materials by replicating three-dimensional (3D) printed polymer parts created by a process, such as for example, micro-stereolithography, using a chemical vapor deposition (CVD) process.

2. Description of the Related Art

Currently, high resolution (i.e., less than or equal to 5 microns ($\mu$m)) complex 3D parts can be fabricated by micro-stereolithography. However, this process is limited to polymers and a few special ceramics.

On the other hand, relatively simple high resolution 3D parts can be fabricated currently by MEMS (Micro Electro-Mechanical Systems). Since MEMS is based on standard semiconductor processing, creation of each layer of the part requires application of a photo-resist and exposure of an optical pattern. In practice, this limits the part to just a few layers, typically six layers or less, so complexity is limited.

While modest resolution (i.e., about 100 microns) complex parts can be made currently with real materials, such as metals, using powder bed fusion processes, higher resolution requires smaller powder grains which is extremely difficult since, as the grains become smaller the surface to volume ratio increases, so that gravity becomes less important and behavior is dominated by electrostatics and other surface phenomena.

However, creating true 3D structures at the sub-micron scale in real materials such as metals has not been achieved.

SUMMARY OF THE INVENTION

A process consistent with the present disclosure relates to a high resolution additive manufacturing method for creating true 3D structures at, for example, the sub-micron scale in real materials such as metals.

In one embodiment, the present invention includes a high resolution additive manufacturing method, including: creating a rigid shell of a stable material on all surfaces except for a sprue of a three dimensional (3D) polymer part using a chemical vapor deposition (CVD) process which includes: depositing the stable material at a process temperature of 100° C. or less, and operating at, or near, atmospheric pressure; and removing the 3D polymer part by accessing the inside of the rigid shell through the sprue to allow dissolution of the 3D polymer part, thereby leaving a replicated rigid shell of the stable material.

In one embodiment, the stable material is a metal.

In one embodiment, the removing of the 3D polymer part comprises dissolving the 3D polymer part in a solvent.

In one embodiment, the sprue comprises a sprue rod for providing access to the inside of the rigid shell for dissolving the 3D polymer part in a solvent.

In one embodiment, the removing of the 3D polymer part comprises ashing the 3D polymer part with a reactive gas.

In one embodiment, the reactive gas comprises atomic oxygen.

In one embodiment, the CVD process utilizes nickel from nickel carbonyl gas with hydrogen sulfide as a catalyst, thereby creating a nickel shell as the stable material.

In one embodiment, the high resolution additive manufacturing method further comprises depositing additional nickel on the nickel shell utilizing a CVD process.

In one embodiment, the high resolution additive manufacturing method further comprises depositing an additional material other than nickel on the nickel shell.

In one embodiment, on condition that the additional material is other than nickel, the high resolution additive manufacturing method further comprises preferentially etching the nickel shell away.

In one embodiment, after the replication and removal of the 3D polymer part, all of the replicated rigid shell is encased in a dissolvable polymer or wax, except for the shell formed around the sprue which has been removed, comprising carrying out a further CVD process which coats the inside of the replicated rigid shell with a further material through an aperture of the sprue shell, and then dissolving away the dissolvable polymer or wax encasing the outside of the replicated rigid shell and etching away the replicated rigid shell, thus leaving an exact replica of the 3D polymer part in the further material.

In one embodiment, the three dimensional (3D) polymer part is formed using micro-stereolithography ($\mu$SL) of a photo-reactive polymer.

In one embodiment, the present invention includes a heated box and sprue assembly for use in a low temperature chemical vapor deposition (CVD) system, including: a heated box comprising a frame having a top wall, a plurality of side plates, and a bottom plate attached to the frame; at least one heater disposed on the heated box; a yoke mounted to the bottom plate; and a sprue rod mounted to the yoke and passing through an opening in the bottom plate, the sprue rod being configured to dispose a 3D polymer part thereon for replicating the 3D polymer part using a CVD process.

Thus has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

DESCRIPTION OF THE INVENTION

Figure 1:
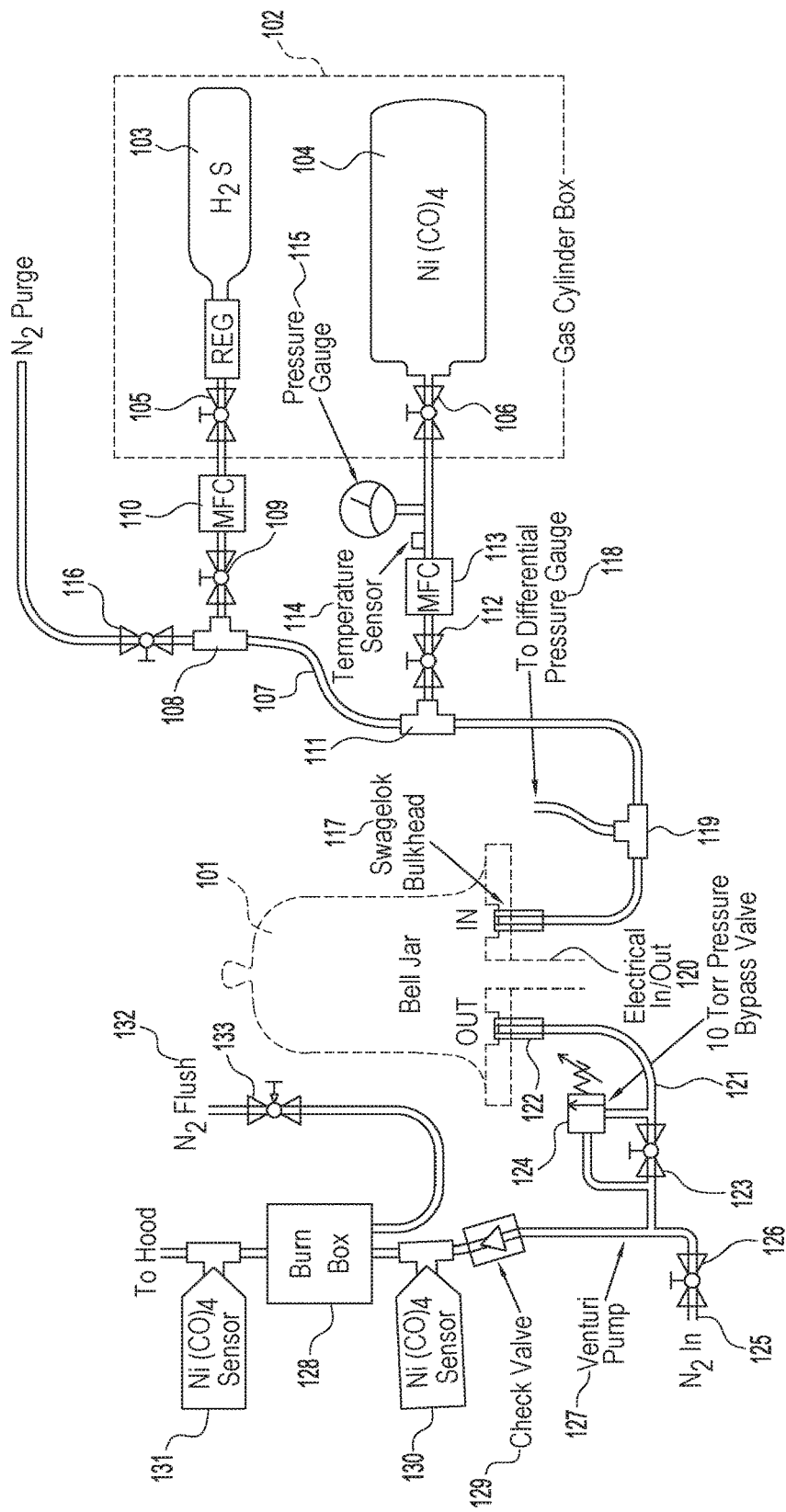
FIG. 1 shows a low temperature Ni CVD system according to an exemplary embodiment consistent with present disclosure.

In recent years, additive manufacturing has evolved from rapid prototyping/3D printing. While 3D printing has historically been based on polymer materials, additive manufacturing is able to build structures using real materials, such as metals. The most common additive manufacturing processes are based on powder bed fusion where a thin layer of powder is spread out and then selectively fused or melted with a laser or electron beam. This process is repeated layer-by-layer with the loose material acting as scaffolding. Once the structure is completed, the loose material is removed, leaving a true 3D structure which can have voids and overhanging features. This technology is sufficiently developed now that it is an accepted adjunct to conventional machining in the same way that Electrical Discharge Machining (EDM) has been for some time.

The present invention relates to high resolution additive manufacturing, for example but not limited to, at the submicron level. This can be thought of as a maskless method of fabricating MEMS.

More specifically, the present high resolution additive manufacturing method combines a method of 3D printing based on, for example but not limited to, micro-stereolithography (µSL) of a photo-reactive polymer with a CVD process in order to obtain high resolution structures formed of real materials such as metals.

Consistent with the present invention, a polymer microstructure or part is created using, for example, the conventional µSL process per se. A suitable conventional µSL apparatus per se includes a laser, a beam delivery and focusing optics including an optical shutter, beam splitters, and focusing lens. Further, computer-controlled precision x-y-z stages are provided, as well as a computer aided design (CAD) design tool in a personal computer (PC), and an in situ process monitoring system.

The scanning control system consists of the precision x-y-z stages, an elevator attached to the z-axis, and an x-y-z stage controller. The elevator is disposed in a vat V of UV curable solution. The polymer microstructure is built up layer by layer in the vat. In the standard fashion, after one layer is solidified, the elevator moves downward and a new layer of liquid resin can be solidified as the next layer.

The CAD tool provides 3D model design of the microstructures, slicing and the numerical control (NC) code generation. The monitoring system may include a charge coupled device (CCD) camera, light source and a monitor of the PC, which enables one to inspect microfabrication processes in situ.

Of course, other processes may be used to create the 3D polymer part, such as NANOSCRIBE's 3D printing technology for the manufacturing of 3D polymer parts where the printer uses a two-photon process.

Once a three dimensional (3D) polymer part is created using, for example, the µSL process or other suitable process, the high resolution additive manufacturing method consistent with the present invention is then carried out.

More specifically, a low temperature CVD process is used to replicate the structure with a "real" material such as a metal. In order to replicate intricate, high resolution 3D structures, a CVD process operating at or near atmospheric pressure is preferred. Since the mean free path at atmospheric pressure is on the order of 100 nm, the vapor can reach into the tiniest features. It is also preferable if the polymer used is also compatible with solvent vapor polishing (which smooths out the steps between the layers).

A suitable low temperature CVD system 100 for carrying out the CVD process is shown in FIG. 1. The low temperature CVD system 100 according to an exemplary embodiment consistent with present disclosure in general provides a means of replacing the air in a bell jar 101 with the nickel carbonyl/hydrogen sulfide gas and safely removing the gases after the deposition is complete.

In particular, on an inlet side of the bell jar 101, the low temperature CVD system 100 may include a gas cylinder box 102 which houses a supply 103 of $H_2S$ and a supply 104 of $Ni(CO)_4$ respectively controlled by suitable control valves 105 and 106. The supply 103 of $H_2S$ may also include a pressure regulator REG and is connected to an inlet line or pipe 107 via a T-connection 108, an additional control valve 109, and a mass flow controller (MFC) 110. Similarly, the supply 104 of $Ni(CO)_4$ is connected to the inlet line 107 via a T-connection 111, an additional control valve 112, an MFC 113, a temperature sensor 114, and a pressure gauge 115. One end of the inlet line 107 serves as an $N_2$ purge through a control valve 116. The other end of the inlet line 107 is connected to the bell jar 101 via, for example, a Swagelok® bulkhead tube fitting 117. The inlet line 107 may also have a connection line 118 for connecting to a differential pressure gauge (not shown) through a T-connection 119. The bell jar 101 includes an in/out 120 for electrical wiring to, for example, heaters and temperature sensors as will be discusses later.

On an outlet side of the bell jar 101, an outlet line or pipe 121 is connected at one end to the outlet of the bell jar 101 via, for example, a Swagelok® bulkhead tube fitting 122. The outlet line 121 includes a control valve 123 and a 10 Torr pressure bypass valve 124. An $N_2$ inlet 125 is connected to the outlet line 121 via a control valve 126 and an inlet of a venturi pump 127. The venturi pump 127 outlet is connected to a burn box 128 via a check valve 129 and an $Ni(CO)_4$ sensor 130. The burn box 128 may be connected to a hood (not shown) via another $Ni(CO)_4$ sensor 131. The burn box 128 is also connected to an $N_2$ flush 132 via a control valve 133.

Figure 2A:
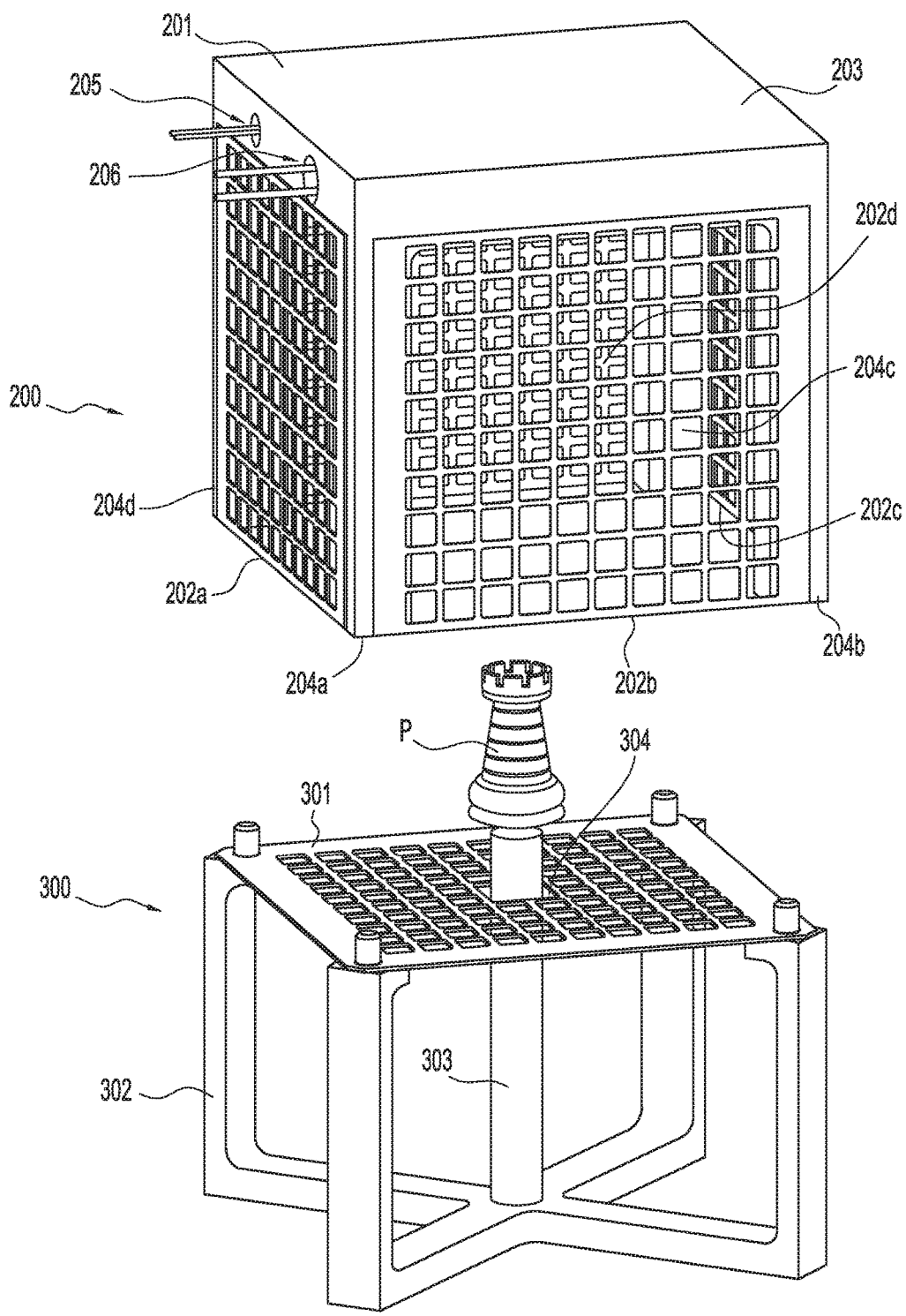
FIG. 2A shows an exploded view of a heated box and sprue assembly according to an exemplary embodiment consistent with present disclosure.
Figure 2B:
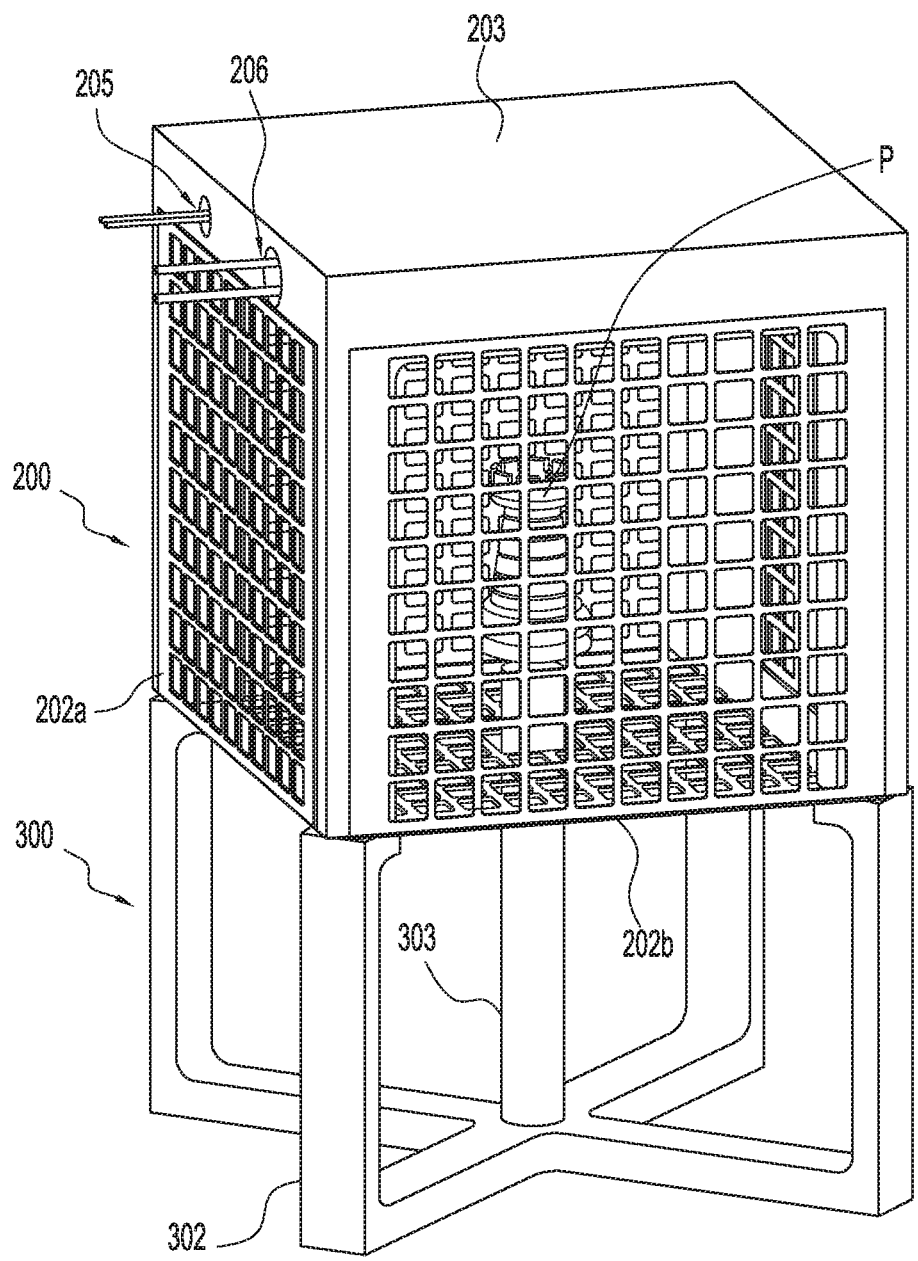
FIG. 2B shows a perspective view of the assembled heated box and sprue assembly according to an exemplary embodiment consistent with present disclosure.
Figure 3:
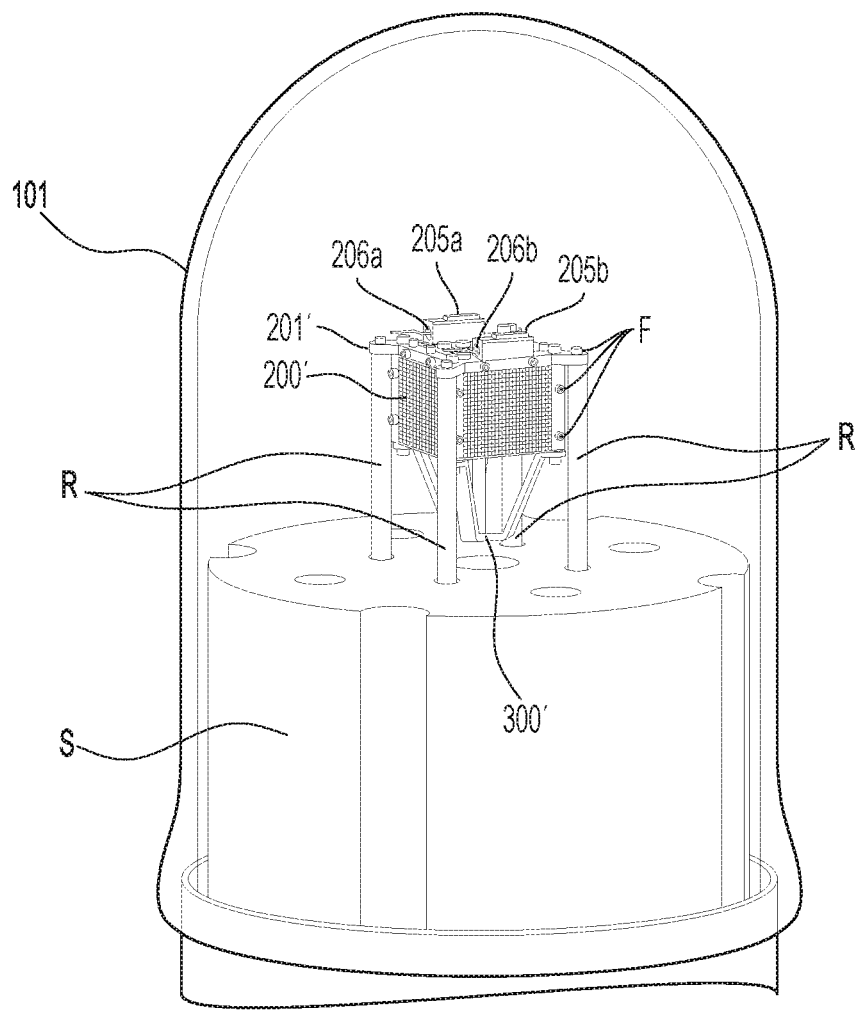
FIG. 3 shows the completed assembly inside the bell jar according to an exemplary embodiment consistent with present disclosure.

FIGS. 2A, 2B, and 3 show the details of the structure inside of the bell jar 101. Since the nickel carbonyl, in the presence of a hydrogen sulfide catalyst, decomposes to deposit elemental nickel in the temperature range of 100° C. or less, preferably 85 to 100° C., the part to be replicated must be heated. FIGS. 2A and 2B show a heated box 200 used for this purpose. In particular, FIG. 2A shows an exploded view of the heated box 200 and sprue assembly 300 according to an exemplary embodiment consistent with present disclosure, while FIG. 2B shows a perspective view of the assembled heated box 200 and sprue assembly 300 according to an exemplary embodiment consistent with present disclosure.

As shown in FIG. 2A, the heated box 200 includes a frame 203 having a top wall 201 and four corner bars 204a, 204b, 204c, and 204d. As a reference for scale, the width of the top wall 201 may be, for example, 1.25 inches (note that this is just an example and that a much smaller heated box and sprue would be used for smaller parts). The frame 203 also includes four side plates 202a, 202b, 202c, and 202d that are attached to the frame 203 via suitable means such as an adhesive, or fasteners such as screws or bolts (not shown). Also, for example, at least one temperature sensor 205 and at least one heater 206 are disposed in, for example, the top wall 201 of the frame 203.

FIGS. 2A and 2B also show the sprue assembly 300 used to provide a sprue that provides a path through the replicated shell in order to access and remove the 3D printed polymer part P after the initial replication process is complete. In particular, the sprue assembly 300 includes a bottom plate 301 of the heated box 200, a yoke 302, a sprue in the form of a sprue rod 303 that may be hollow, and the 3D printed polymer part P according to an exemplary embodiment consistent with present disclosure. When assembled, the sprue assembly 300 is fastened to the bottom of the heated box 200 using adhesive or fasteners (not shown). Like the 3D printed polymer part P to be replicated, the hollow sprue rod 303 and the yoke 302 are made of a dissolvable polymer. As shown in FIGS. 2A and 2B, the sprue rod 303 is mounted to the yoke 302 and passes through an opening 304 in the bottom plate 301. The 3D printed polymer part P to be replicated is disposed on the top of the hollow sprue rod 303. As noted above, the sprue rod 303 provides a path to get to the original 3D printed polymer part P, so that the part P can be dissolved away after the replicated shell has been deposited.

The overall assembly of the heated box 200 and the sprue assembly 300 in the bell jar 101 is shown in FIG. 3. In this case, a variation of the heated box and sprue assembly 200'/300' is shown in FIG. 3. In particular, fasteners F, such as screws or bolts, are used to assemble the heated box 200'. Also, two temperature sensors 205a and 205b are disposed on the heated box 200' at locations where respective heaters 206a and 206b are disposed on a top plate 201' of the heated box 200'. A spacer S is provided in the bell jar 101 to reduce the volume of the bell jar 101 and four hollow rods R are inserted into the spacer S and act as thermally insulating supports for the heated box 200'/sprue assembly 300'.

In brief, the process steps for carrying out the CVD process using low temperature CVD system 100 consistent with the present invention are as follows: step 1, purge the bell jar 101; step 2, turn on the heater 206 of the heated box 200; step 3, backfill the bell jar 101 with the nickel carbonyl/hydrogen sulfide mixture; and once the nickel shell has been deposited, step 4, purge the system and backfill with air to atmospheric pressure; and finally step 5, remove the entire heated box 200 and sprue assembly 300 and submerse it in a pre-heated solvent bath. Since the lower part of the sprue assembly 300 is well below the heated box 200 during the deposition, it will not be coated with the nickel.

The 3D printing process, such as the μSL process, and the high resolution additive manufacturing process, which utilizes the low temperature CVD process to replicate the 3D polymer part, can be carried out, for example, in stages at separate stations. As discussed in more detail below, once the rigid shell of a stable material is formed on almost all surfaces (that is, except for the sprue) of the 3D polymer part using the CVD process, the 3D polymer part is removed, thereby leaving the replicated rigid shell of the stable material.

In one embodiment, the high resolution additive manufacturing process includes the step of creating a rigid shell of a stable material on all surfaces except for a sprue of a 3D polymer part using the CVD process which includes: depositing the stable material at a process temperature of about 100° C. or less so as not to distort the polymer, and operating at, or near, atmospheric pressure so the mean free path of the gas molecules will be small enough such that the smallest cavities will be coated during the CVD process; and the step of removing the 3D polymer part by accessing the inside of the rigid shell through the sprue to allow dissolution of the 3D polymer part, thereby leaving a replicated rigid shell of the stable material.

An exemplary CVD process is based on nickel carbonyl with hydrogen sulfide as a catalyst. This process is preferably carried out in the 85 to 100° C. range, so that it is compatible with polymer resins. Once the CVD process is complete, the polymer can be dissolved away. It is important to maintain the temperature used for the CVD process during the dissolution of the polymer because of the large difference in coefficient of thermal expansion (CTE) between the polymer and the nickel or other CVD material. The removal of the 3D polymer part comprises dissolving the 3D polymer part in a solvent. As noted above, the sprue rod 303 provides a path to gain access to the original 3D printed polymer part P, so that the part P can be dissolved away after the replicated shell has been deposited. Alternatively, removal of the 3D polymer part comprises ashing the 3D polymer part with a reactive gas such as atomic oxygen.

Thus, the present invention uses a low temperature CVD process (such as nickel carbonyl with hydrogen sulfide) to build up a shell around a polymer microstructure or part created by, for example, the μSL process. Once the shell is complete and the polymer structure has been replicated in nickel, the polymer structure can be dissolved away through the path provided by the sprue rod thus leaving the nickel shell. Since the melting point of nickel is 1455° C., virtually any material that can be deposited by CVD could replicate the nickel structure, where the nickel can then be preferentially etched away afterward, if necessary. The shell can be used as is, or as a mold for a higher temperature CVD of another material such as quartz or another metal.

In a further embodiment, after the initial replication and removal of the original 3D polymer part, all of the replicated shell is encased in a dissolvable polymer or wax, except for the shell of the (now gone) sprue as it has been removed. Then a second CVD process is carried out which coats the inside of the replicated shell with a third material through the aperture of the sprue. Finally, the dissolvable polymer or wax encasing the outside of the initial replicated shell (which is formed of, for example, nickel) is dissolved away and the initial replicated nickel shell is etched away, thus leaving an exact replica of the original 3D polymer part in the third material (e.g., a material like quartz or silicon carbide).

Figure 4:
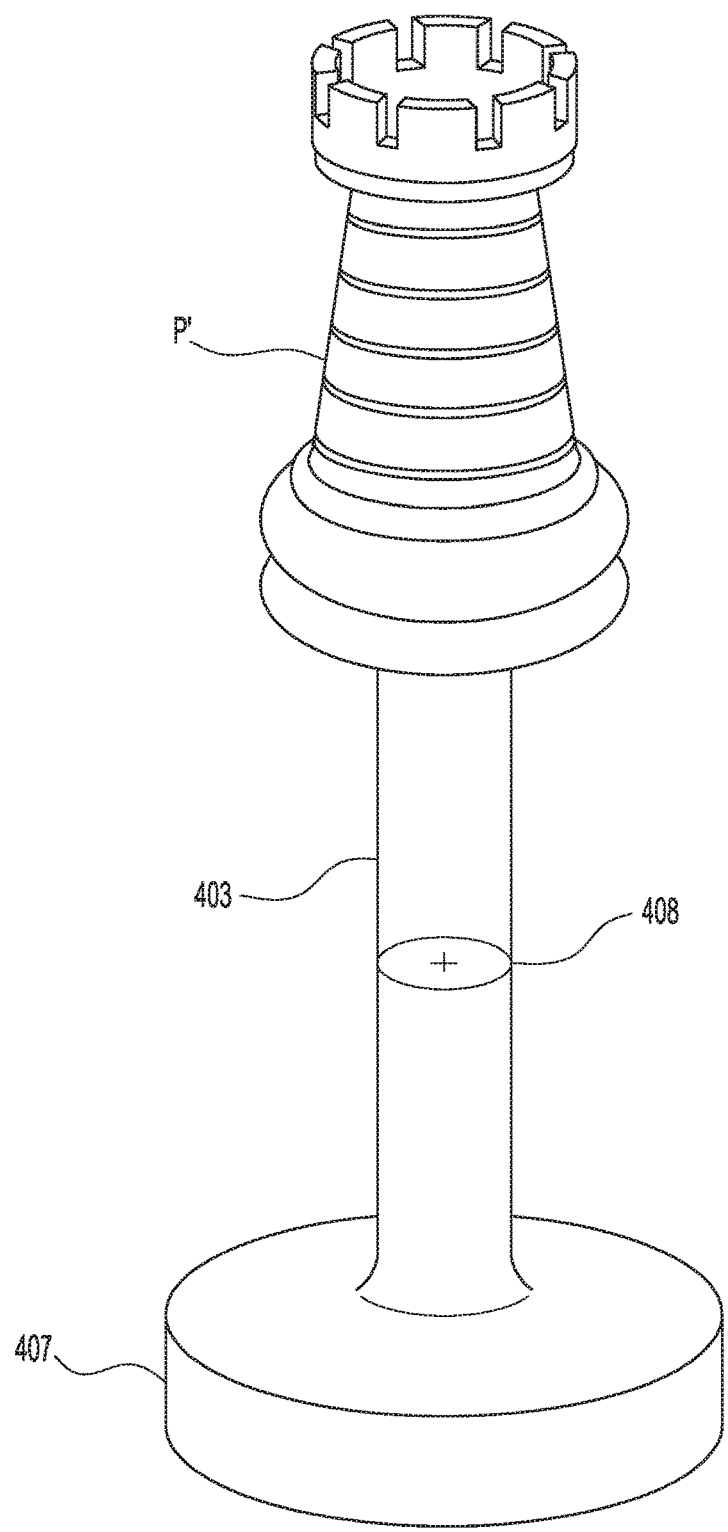
FIG. 4 shows an alternative embodiment consistent with present disclosure.

In a still further embodiment, a CVD process may be used where the species is generated elsewhere and then introduced to a chamber where all surfaces will be coated. One example of such a process is ECR-PECVD (electron cyclotron resonance plasma enhanced chemical vapor deposition). For this case, a simple polymer rod-like sprue 403 could be attached using, for example, glue, to the part P' to be replicated. After the part P' and sprue 403 have been coated, one would simply cut or saw through the coating and sprue, exposing uncoated polymer, so that solvent could enter and dissolve the rod and original polymer part P' (see FIG. 4). The expanded base 407 is simply a way to keep the assembly from falling over. After the deposition, the rod-like portion would be cut near the circle 408.

Consistent with the present invention, for example, structures with 5 μm$^3$ voxels (note that a voxel is the 3D equivalent of a 2-dimensional (2D) pixel) are possible. Using a krypton fluoride excimer laser, it should be possible to create structures with voxels as small as 0.25 to 0.50 μm on a side.

In summary, an embodiment consistent with the present invention provides a CVD process that does not require heating the 3D printed polymer part to more than about 100° C. so the part is not distorted; a CVD process that operates at or near atmospheric pressure so the mean free path will be on the order of 100 nm, thus allowing access to the smallest cavities and other features; and a sprue or similar mechanism that, after the CVD shell has been deposited, allows access to the original polymer part so that it can be dissolved or ashed away.

The present invention has several potential applications. One example is to solve a problem with complementary metal oxide semiconductor (CMOS) sensor arrays. The current CMOS technology is front side illuminated. Since some of the area is used for electronic elements, the arrays have a fill factor of 75% or less. For visible light applications, this can be solved with a micro-lens array. However, micro-lenses are not practical for ultraviolet (UV) or near infrared (NIR) applications. The technology described here could be used to fabricate a 2-dimensional array of reflective Winston-like cones, which would perform the same function as a micro-lens array, but for a much broader spectral range. These cone arrays could also be used for other sensor technologies with limited fill-factor, such as thermal detector arrays.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A high resolution additive manufacturing method of fabricating high resolution, complex parts in metals and other materials by replicating three-dimensional (3D) printed polymer parts at the sub-micron scale, comprising:
    creating a rigid shell of a stable metal material on all surfaces except for a sprue, the sprue comprising a polymer sprue rod, for providing access to the inside of the rigid shell for dissolving the 3D polymer part in a solvent of a three dimensional (3D) polymer part using a chemical vapor deposition (CVD) process. operating at a mean free path at atmospheric pressure on the order of 100 nm, which includes:
    depositing the stable metal material at a process temperature of 100° C. or less, and operating at, or near, atmospheric pressure; and
    removing the 3D polymer part by accessing the inside of the rigid shell through the sprue to allow dissolution of the 3D polymer part, thereby leaving a replicated rigid shell of the stable metal material; wherein the removing of the 3D polymer part comprises dissolving the 3D polymer part in the solvent; whereby the method utilizes a gas cylinder box attached to an inlet side of a bell jar which houses a supply of $H_2S$ and a supply of $Ni(CO)_4$ respectively, controlled by a pair of first and second control valves and also including the step of regulating of $H_2S$ with a pressure regulator connected to an inlet line via a T-connection, an additional control valve, and a mass flow controller where the supply of $Ni(CO)_4$ is connected to the inlet line via a T-connection, an additional control valve, a mass flow controller, a temperature sensor, and a pressure gauge connected to an end of the inlet line serving as an $N_2$ purge through a control valve.

2. The high resolution additive manufacturing method of claim 1, wherein the CVD process utilizes nickel with hydrogen sulfide as a catalyst, thereby creating a nickel shell as the stable metal material.

3. The high resolution additive manufacturing method of claim 2, further comprising:
    depositing additional nickel on the nickel shell utilizing a CVD process.

4. The high resolution additive manufacturing method of claim 2, further comprising:
    depositing an additional material other than nickel on the nickel shell.

5. The high resolution additive manufacturing method of claim 4, wherein, on condition that the additional material is other than nickel, preferentially etching the nickel shell away.

6. The high resolution additive manufacturing method of claim 1, wherein after the replication and removal of the 3D polymer part, all of the replicated rigid shell is encased in a dissolvable polymer or wax, except for the shell formed around the sprue which has been removed, comprising carrying out a further CVD process which coats the inside of the replicated rigid shell with a further material through an aperture of the sprue shell, and then dissolving away the dissolvable polymer or wax encasing the outside of the replicated rigid shell and etching away the replicated rigid shell, thus leaving an exact replica of the 3D polymer part in the further material.

7. The high resolution additive manufacturing method of claim 1, wherein the three dimensional (3D) polymer part is formed using micro-stereolithography (μSL) of a photoreactive polymer.

* * * * *